United States Patent [19]
Heidemann

[11] Patent Number: 5,473,286
[45] Date of Patent: Dec. 5, 1995

[54] MICROWAVE GENERATOR CIRCUIT HAVING OSCILLATOR AND CONTROLLER RESPONSIVE TO SEPARATE WAVELENGTHS

[75] Inventor: Rolf Heidemann, Tamm, Germany

[73] Assignee: Alcatel N.V., Amsterdam, Netherlands

[21] Appl. No.: 198,831

[22] Filed: Feb. 18, 1994

[30] Foreign Application Priority Data

Feb. 20, 1993 [DE] Germany ............................ 43 05 254.1

[51] Int. Cl.$^6$ ..................................................... H03L 7/24
[52] U.S. Cl. ...................... 331/66; 331/108 R; 331/172
[58] Field of Search ........................ 331/64, 104, 108 R, 331/109, 135, 172, 173, 66; 359/162

[56] References Cited

U.S. PATENT DOCUMENTS

| | | | |
|---|---|---|---|
| 4,028,638 | 6/1977 | Towle ...................................... | 331/109 |
| 4,264,875 | 4/1981 | Hunsperger et al. ...................... | 331/66 |
| 4,503,403 | 3/1985 | Taylor et al. ............................. | 331/37 |
| 4,849,716 | 7/1989 | Golio et al. .............................. | 331/66 |
| 5,347,235 | 9/1994 | Higgins et al. ........................... | 331/66 |

FOREIGN PATENT DOCUMENTS 2179817  8/1985  United Kingdom .

OTHER PUBLICATIONS

"Direct Optical Injection–Locking and Tuning of CW Oscillators", R. Simons, *Optical Control of Microwave Devices*, Artech House, 1990 Boston & London, Chapter 10, Sec. 10.5, pp. 213 et. seq.

"Initial Observations of Optical Injection Locking of Oscillators Using Heterojunction Bipolar Transistors", A. Bangert et al, *Electronics Letters*, vol. 28, No. 7, Mar. 26, 1992, Stevenage, Herts, GB, pp. 621–623.

"Optical Phase Control of an Optically Injection–Locked FET Microwave Oscillator", R. Esman et al, *IEEE Transactions of Microwave Theory and Techniques*, vol. 37, No. 10, Oct. 1, 1989, New York, pp. 1512–1518.

*Primary Examiner*—Robert J. Pascal
*Assistant Examiner*—David H. Vu
*Attorney, Agent, or Firm*—Ware, Fressola, Van Der Sluys & Adolphson

[57] ABSTRACT

A microwave generator has its microwave frequency optically phase-locked by means of a reference frequency of a reference signal, wherein at least one portion of an electronic circuit arrangement is supplied with an optical reference carrier signal modulated with the reference frequency. The circuit arrangement (16) includes two components (Q1 to Q6; Q10, Q11) based on different semiconductor types which are chosen so that one of them, the first component, which is of a first semiconductor type, optically responds to the reference carrier signal (3) and, thus, to the reference frequency ($f_1$Mod1 . . . Modn) for achieving synchronization, and that—independently of the response of the first component—the other, second component, which is of a second semiconductor type, responds to an optical control carrier signal (6) differing in frequency from the reference carrier signal (3). The amplitude of the first component is controlled by means of a control signal (7) modulated onto the optical control carrier signal (6).

15 Claims, 5 Drawing Sheets

MICROWAVE GENERATOR CIRCUIT HAVING OSCILLATOR AND CONTROLLER RESPONSIVE TO SEPARATE WAVELENGTHS

TECHNICAL FIELD

The present invention relates to a microwave generator whose microwave frequency is optically phase-locked to a reference signal by means of a reference frequency, wherein at least one portion of an electronic circuit arrangement is supplied with an optical reference carrier signal modulated with the reference frequency.

BACKGROUND OF THE INVENTION

From a book by Rainee Simons, "Optical Control of Microwave Devices", Artech House, Chapter 10.5, "Direct Optical Injection-Locking and Tuning of CW Oscillators", a microwave oscillator is known whose frequency is stabilized by optoelectronic means. The technique used to do this is called "injection locking". It permits frequency stabilization by all-optical means.

DISCLOSURE OF INVENTION

Starting from this prior art, the invention has for its object to both achieve frequency stabilization in and effect control (modulation, tuning, etc.) of a microwave generator by all-optical means.

According to the present invention, the circuit arrangement includes two components based on different semiconductor types which are chosen so that one of the two components, the first component, which is of a first semiconductor type, optically responds to the reference carrier signal and, thus, to the reference frequency for achieving synchronization, and wherein, independently of the response of the first component, the other, second component, which is of a second semiconductor type, responds to an optical control carrier differing in frequency from the reference carrier signal, and that a control signal modulated onto said optical control signal is used to control the amplitude of the first component.

With this circuit design, injection locking and control, such as modulation, can be accomplished by optical means using two separate wavelengths. Use is made of the different band gaps resulting from the choice of the semiconductor types with respect to a photoelectric response of these components. One of the semiconductor types responds to the optical reference carrier signal; the other semiconductor type responds to the optical control carrier signal. One semiconductor type, the first type, is used to implement the oscillator circuit of the microwave generator, and the other, second semiconductor type serves to control the amplitude of the oscillator circuit. With the control signal modulated onto the control carrier signal, amplitude modulation of the microwave available at the output of the microwave generator is thus possible. It is also possible to switch the generator on and off by means of the control signal, i.e., to key it. This, too, permits a transmission of information.

According to another advantageous aspect of the invention, the components of both semiconductor types are arranged, preferably monolithically integrated, on a common wafer (substrate).

Advantageously, the semiconductor types include silicon (Si). In a preferred embodiment, the first semiconductor type is at least one silicon-germanium transistor, particularly a silicon-germanium heterobipolar transistor (Si—Ge HBT). This semiconductor type responds photoelectrically, preferably to light with a wavelength of about 1.3 µm.

The component of the second semiconductor type—in a preferred embodiment of the invention—is at least one silicon bipolar transistor (Si bip.T). The second semiconductor type responds photoelectrically, particularly only to light with a wavelength of about 800 or 980 nm and not to light with a wavelength of about 1.3 µm. Accordingly, the two semiconductor types respond to different wavelengths of the signals.

As mentioned, the component of the first semiconductor type forms part of an oscillator circuit of the microwave generator. The component of the second semiconductor type is contained in a power supply circuit (e.g., integrated current source) for the oscillator circuit.

The control signal is preferably chosen to hold the oscillator circuit of the microwave generator in a locking range.

In another embodiment of the invention, the reference carrier signal comprises not only one reference signal, but a plurality of reference signals of different frequencies, since the control signal influences not only the amplitude but also, in the unsynchronized condition, the frequency of the oscillator. The control signal can then preferably be changed to switch the oscillator circuit from its current locking range, assigned to one of the reference signals, to another locking range, assigned to another one of the reference signals, with the oscillator circuit possibly passing through a free-running range. The circuit acts as a frequency and channel selector.

These and other objects, features and advantages of the present invention will become more apparent in light of the following detailed description of a best mode embodiment thereof, as illustrated in the accompanying drawing.

BRIEF DESCRIPTION OF THE DRAWING

FIG. 1B(b) is a graph showing a control signal having a frequency $F_2$ which is used to modulate an optical control carrier signal;

FIG. 1B(c) is a graph showing the output A of the microwave generator of FIG. 1A;

BEST MODE FOR CARRYING OUT THE INVENTION

Figure 1A:
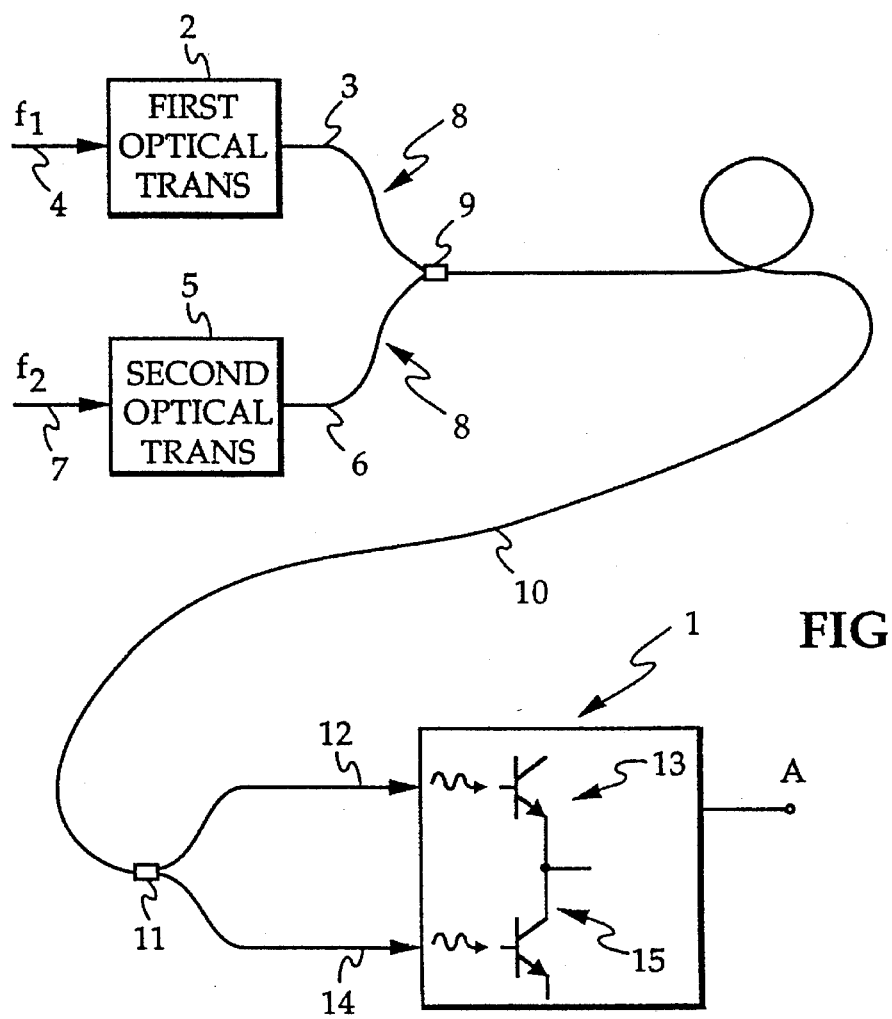
FIG. 1A shows a circuit arrangement of a microwave generator and optical sources for synchronization and control in block-diagram form.

FIG. 1A shows one embodiment of an optical transmission system having an optical receiver, also known herein as a microwave generator 1, according to the present invention. An optical transmitter 2 generates an optical reference carrier signal 3 with a wavelength of 1.3 µm. The reference carrier signal 3 is modulated with a frequency $f_1$ of a reference signal 4. The reference signal 4 has a frequency of 30 GHz, for example. A second optical transmitter 5 generates an optical control carrier signal 6 with a wavelength of, e.g., 800 nm. The optical control carrier signal 6 is modulated with a frequency $f_2$ of a control signal 7. The two modulated signals 3 and 6 are transmitted through optical waveguides 8 to a multiplexing fiber coupler 9, then over a fiber-optic link 10 to a demultiplexing fiber coupler 11. The reference carrier signal 3, modulated with the reference signal 4, is transmitted through an optical waveguide 12 to an oscillator circuit 13 of the microwave generator 1. The control carrier signal 6, modulated with the control signal 7, is transmitted through an optical waveguide 14 to a control circuit 15 of the microwave generator 1.

Figure 1B:
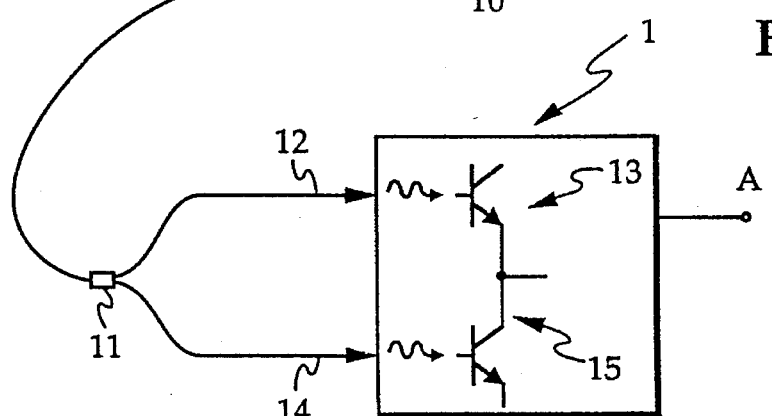
FIG. 1B(a) is a graph showing a reference signal having a frequency $F_1$ which is used to modulate a carrier signal.
Figure 1B:
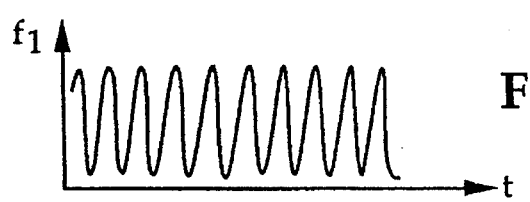
Figure 1B:
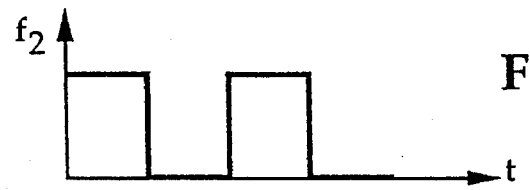
Figure 1B:
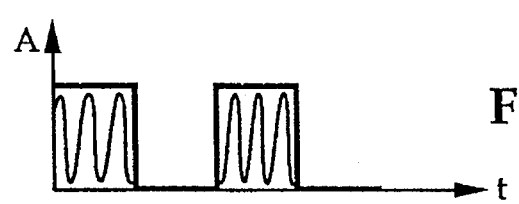

FIG. 1B includes three graphs (a), (b) and (c) on a common timeline. FIG. 1B(a) shows the reference signal 4 as a function of time. FIG. 1B(b) shows the control signal 7, also as a function of time. At the output A of the microwave generator 1, the signal shown in FIG. 1B(c) is available. It is a microwave signal formed by superposition of the reference signal and the control signal. As can be seen, the control signal switches the microwave generator 1 on and off, i.e., the microwave generator 1 operates digitally. It is also possible, however, to amplitude-modulate the microwave signals appearing at the output A by means of the control signal 7, e.g., to vary the amplitude rather than switching the generator on and off.

The microwave signal at the output A is frequency-locked. This is caused by the reference signal 4. To permit optical transmission, the reference carrier signal 3 is necessary, which is modulated with the reference signal 4. The reference signal 4 is a stable-frequency signal generated by an arbitrary device, and serves to frequency-lock the microwave generator 1 by the injection-locking technique. By feeding the optical reference carrier signal 3 into the circuit arrangement of the microwave generator 1, a photoelectric effect is achieved, so that the oscillator circuit 13 can respond to the reference signal 4 and, thus, to the reference frequency $f_1$. In this manner, frequency synchronization is accomplished.

A photoelectric effect also occurs between the circuit arrangement of the microwave generator 1 and the control carrier signal 6, so that the control signal 7 can act on the control circuit 15.

Figure 2:
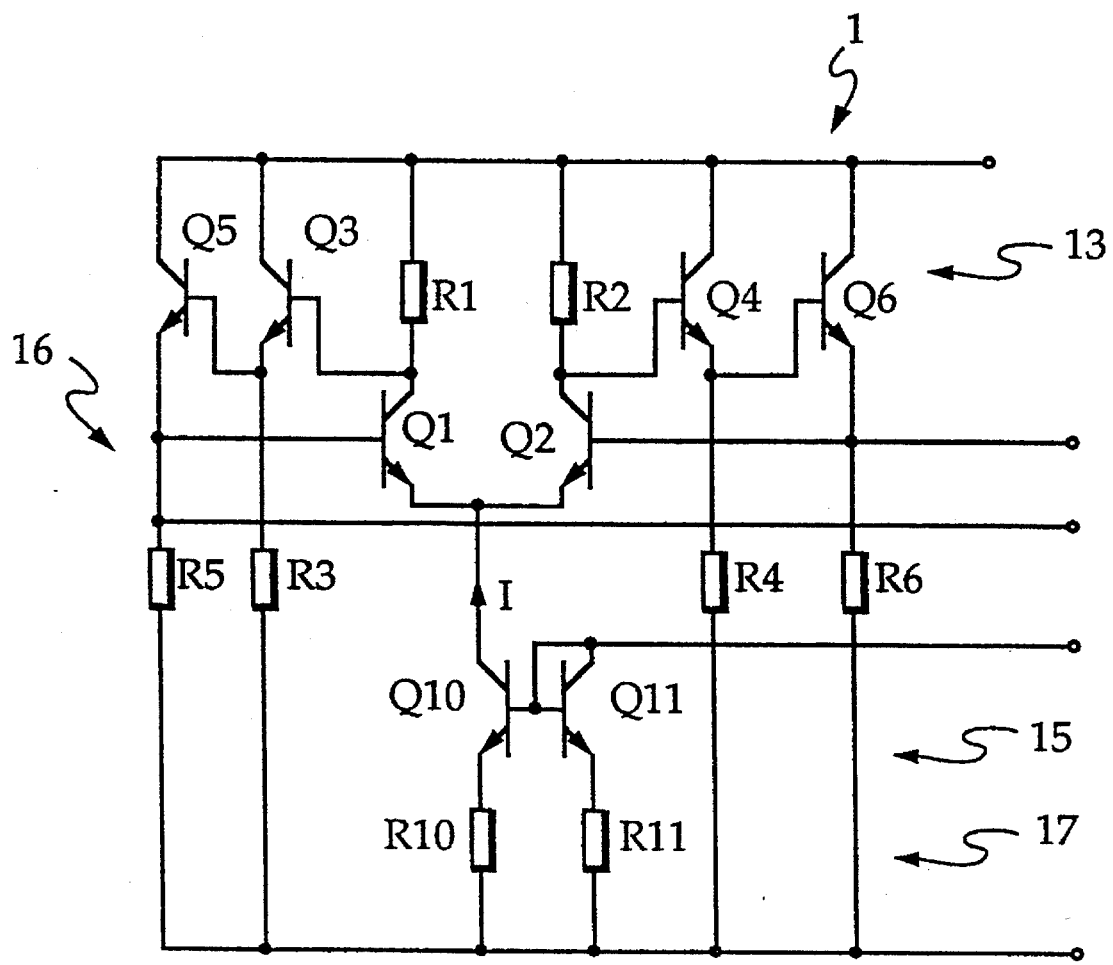
FIG. 2 is a schematic circuit diagram of a microwave generator, according to the present invention.

FIG. 2 shows a schematic circuit diagram of the microwave oscillator 1. In the upper portion, the circuit arrangement 16 contains semiconductors Q1, Q2, Q3, Q4, Q5, and Q6. These components are transistors. Each of the semiconductor transistors Q1, Q2, Q3, Q4, Q5, Q6 has an associated resistor R1, R2, R3, R4, R5, R6. They belong to the oscillator circuit 13, which forms a high-frequency stage, so to speak. The lower portion of the circuit arrangement 16 contains the semiconductors Q10 and Q11, which belong to the control circuit 15. These components are also transistors. Each of the semiconductor transistors Q10, Q12 has an associated resistor R10, R11, R3, R4, R5, R6. The semiconductors Q1 to Q6 are of a first semiconductor type, and the semiconductors Q10 and Q11 are of a second semiconductor type. Both semiconductor types are integrated on a silicon substrate. Preferably, the first transistor type is a silicon-germanium heterobipolar transistor (Si—Ge HBT), and the second transistor type is a silicon bipolar transistor (Si bip.T).

The light arriving over the optical waveguides 12 and 14 is directed onto at least one transistor of the oscillator circuit 13 and one transistor of the control circuit 15, respectively, such that the oscillator circuit 13 receives the reference carrier signal 3 modulated with the reference signal 4, while the control circuit 15 receives the control carrier signal 6 modulated with the control signal 7. In this manner, an influence is exerted via photoelectric effects such that the oscillator circuit 13 is synchronized with the reference frequency $f_1$ of the reference signal 4, so that injection locking is achieved. This means that the microwave generator 1 oscillates in phase with the reference frequency $f_1$. The current I flowing into the oscillator circuit 13 can be adjusted by means of the control signal 7. The transistors Q10 and Q11, together with the resistors R10, R11 associated therewith, thus form a power supply circuit 17 for the HF stage of the microwave generator 1.

Figure 3A:
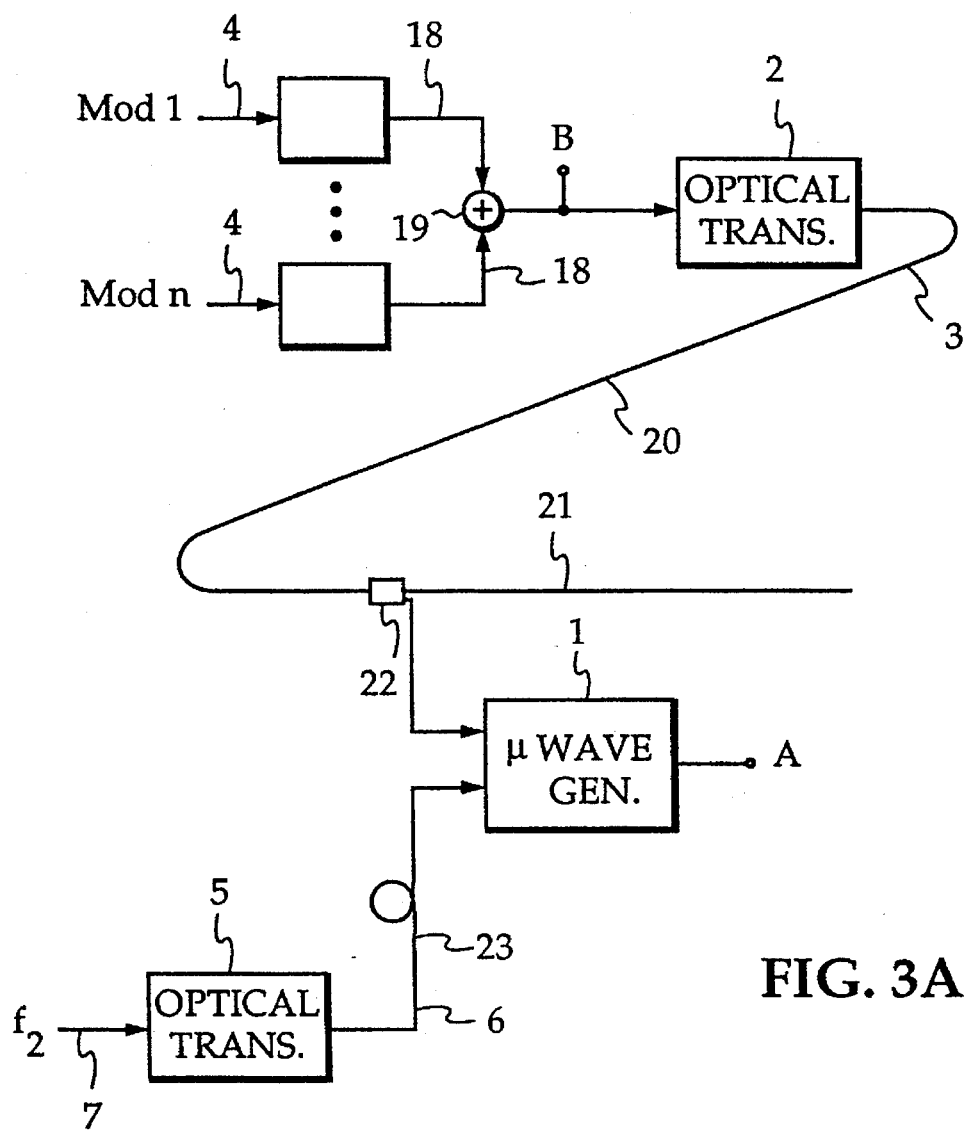
FIG. 3A shows another embodiment of a circuit arrangement, according to the present invention and FIG. 3B(a) is a graph showing various modulation signals (Mod1, ..., Modn) with respective microwave subcarriers, which may have an information content.
Figure 3B:
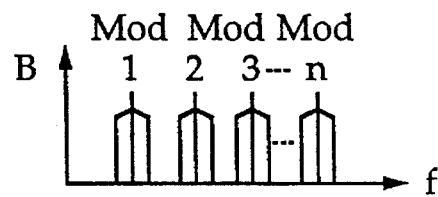
FIG. 3B(b) is a graph showing the output A of the microwave generator of FIG. 3A.

FIG. 3A shows another embodiment of the invention, which differs from the embodiment of FIG. 1 particularly in that not only one reference signal, but a plurality of reference signals 4 with different frequencies are present. These different reference signals are designated as modulating signals Mod1 to Modn. They are fed over conductors 18 to a summing point 19. The output B of the summing point 19 provides the signal according to the graph of FIG. 3B(a). This graph shows the various modulating signals Mod1 ... Modn with respective microwave subcarriers, which may have an information content. The reference signal(s) 4 or Mod1 ... Modn may be modulated in frequency or phase. In the locked mode, the generator 13 follows those frequency or phase changes. In this manner, frequency- or phase-modulated transmission is possible.

The output B of the summing point 19 is coupled to an optical transmitter 2 which—like in the embodiment of FIG. 1—has a wavelength of 1.3 µm. The optical reference carrier 3 thus formed, which is modulated with the different reference signals 4, is then transmitted through an optical waveguide 20, which forms, for example, a fiber bus 21 (if two or more generators have to be controlled), to a fiber coupler 22. The signal coupled out by the fiber coupler 22 is fed to the microwave generator 1.

Like in the embodiment of FIG. 1, an optical transmitter 5 is supplied with a control signal 7 of frequency $f_2$, and the control-frequency-modulated control carrier signal 6 is transmitted through an optical waveguide 23 to the control circuit 15 of the microwave generator 1. With this arrangement it is possible to selectively injection-lock the microwave generator 1 to any one of the different reference frequencies Mod1 ... Modn, the selection of the reference frequency being possible by means of the control signal 7, particularly by remote control. The graph of FIG. 3B(b) shows the output of with the frequency $f_0$ representing the center frequency of the microwave generator 1 of FIG. 3A as the instantaneous frequency is determined by the corresponding channel. It is possible, for example, to use this arrangement as a tunable active filter. How the arrangement operates will now be explained in more detail with reference to FIGS. 4 to 6.

Figure 4A:
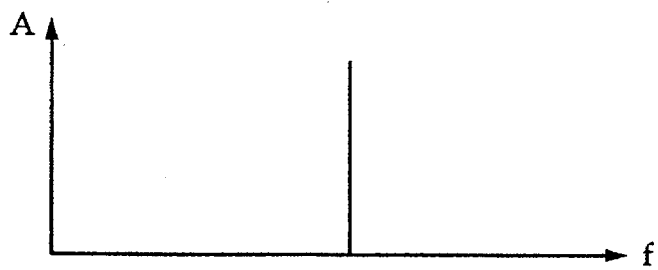
FIG. 4(a) is a graph showing the amplitude at the output of the microwave generator of FIG. 3A as a function of frequency.
Figure 4B:
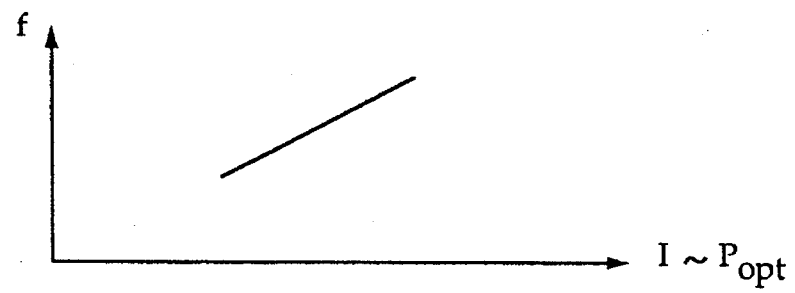
FIG. 4(b) is a graph showing the frequency of the output of the microwave generator of FIG. 3A as a function of the current delivered by a power supply circuit of the microwave generator of FIG. 3A, assuming that no reference signal, and consequently, no reference carrier signal is present and therefore the microwave generator is in a free running state.
Figure 4C:
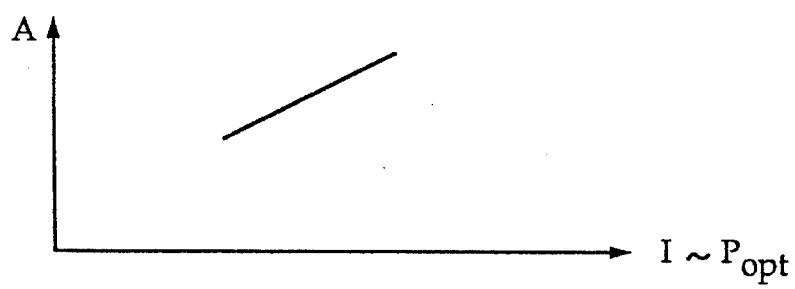
FIG. 4(c) is a graph showing the amplitude of the output of the microwave generator of FIG. 3A as a function of current delivered by the power supply circuit of the microwave generator, assuming that the microwave generator is in a free running state.

FIG. 4(a) shows the output of the microwave generator 1 of the embodiment of FIG. 3A as a function of frequency. It can be seen that a particular frequency is generated, assuming that the control circuit 15 for the oscillator circuit 13 of the generator delivers a constant current. It is also assumed in the graphs of FIG. 4(a)–(c) that no reference signal 4 and, consequently, no reference carrier signal 3 is present, i.e., the microwave generator 1 is in a free-running state; it is not synchronized by the light of the optical transmitter 3. When—according to the of FIG. 4(b)—the current I delivered by the power supply circuit 17, which corresponds to an optical power $P_{opt}$, is increased, the frequency f at the output of the microwave generator 1 rises. The amplitude at the output A of the microwave generator 1 increases correspondingly as the current I increases. This is apparent from FIG. 4(c) wherein FIGS. 4(b) and 4(c) share a common abscissa.

Figure 5A:
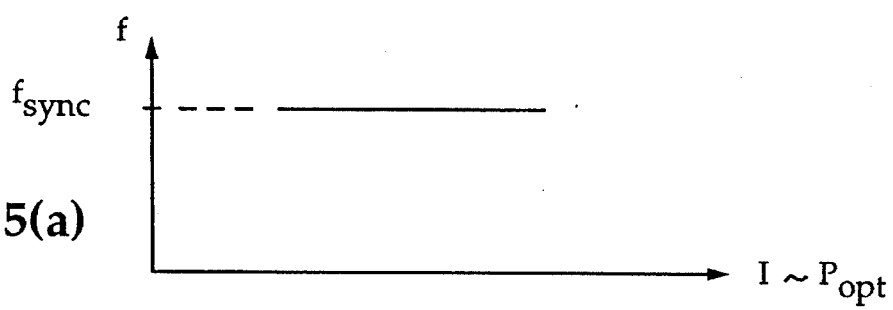
FIG. 5(a) is a graph showing the frequency of the output of the microwave generator of FIG. 3A as a function of current delivered by the power supply circuit of the microwave generator when a reference signal is being supplied to the microwave generator.
Figure 5B:
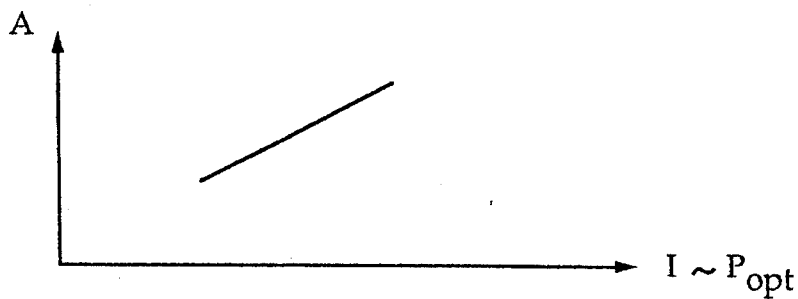
FIG. 5(b) is a graph showing the amplitude of the output of the microwave generator of FIG. 3A as a function of the current delivered by the power supply circuit of the microwave generator when a reference signal is being provided to the microwave generator.

By contrast, if, according to the graphs of FIG. 5(a) and (b), which also share a common abscissa, a reference signal 4 is fed to the chip of the microwave generator 1 by means of an optical reference carrier signal 3, there is no frequency change as a function of the current I, i.e., the synchronized frequency $f_{sync}$ shown in of FIG. 5(a) is present. In case of a change in current, only the amplitude at the output A of the microwave generator 1 increases as shown in FIG. 5(b).

Figure 6A:
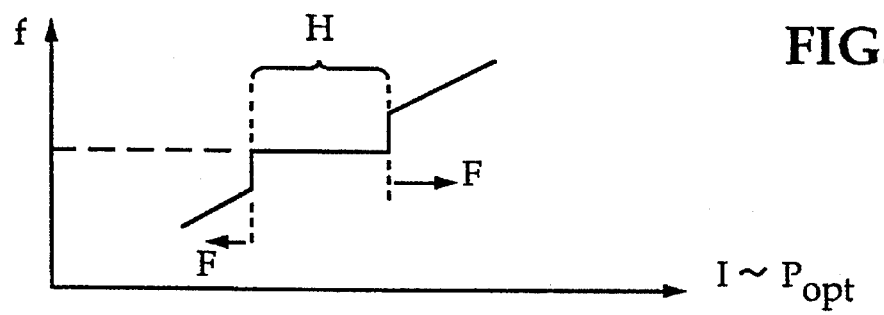
FIG. 6(a) is a graph showing the frequency of the output of the microwave generator of FIG. 1A as a function of the current delivered by the power supply circuit of the microwave generator showing a change in frequency in response to excessive detuning of the microwave generator.
Figure 6B:
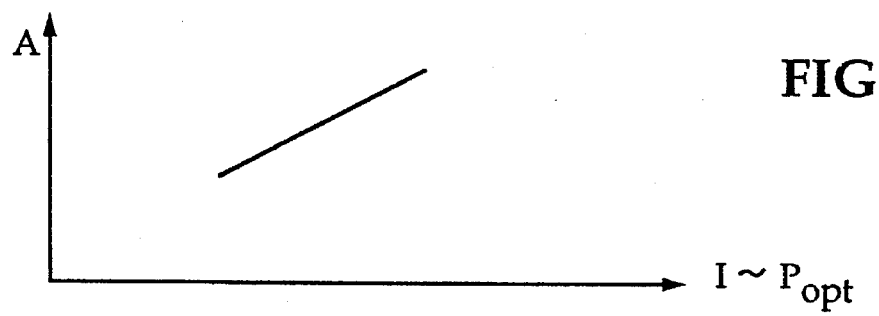
FIG. 6(b) is a graph showing the amplitude at the output of the microwave generator of FIG. 1A as a function of the current of the power supply circuit of the microwave generator.

FIG. 4 thus shows a free-running mode of the microwave generator 1, while FIG. 5 shows the synchronized mode, i.e., the injection-locked state. This injection-locked state is again illustrated in FIG. 6(a). In all generators, injection locking can only be maintained in a particular range, the locking range H. Only in this range, which corresponds to a given current I of the power supply circuit 17 or to a given, corresponding optical power $P_{opt}$, will the oscillator frequency remain locked to the frequency of the injected signal In case of excessive "detuning", the generator will leave the locking range H and enter the free-running range F, i.e., it will no longer be synchronized. FIG. 6(b) shows the amplitude at the output A of the microwave generator as a function of the current I, which corresponds to the optical power $P_{opt}$. FIG. 6(a) and (b) relate to a circuit arrangement according to the embodiment of FIG. 1, i.e., to the case where only one reference signal of a particular frequency is present.

Figure 3B:
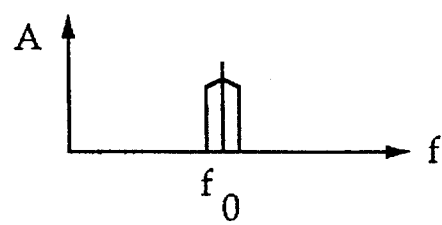
Figure 6C:
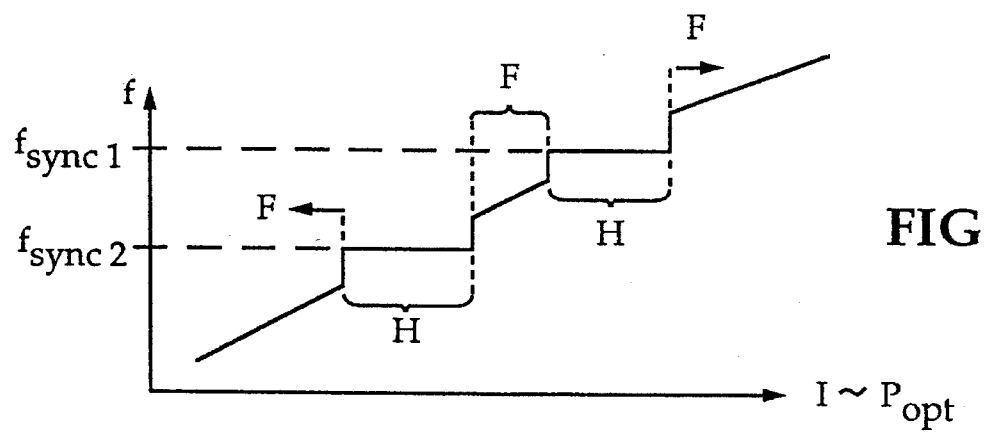
FIG. 6(c) is a graph showing the frequency of the output of the microwave generator of FIG. 3A as a function of the current supplied by the power supply circuit of the microwave generator.

FIG. 6(c) illustrates how the embodiment of FIG. 3 works the current I of the power supply circuit is varied by means of the optical power $P_{opt}$ of the control signal 7 in such a way that the oscillator circuit 13 leaves the locking range H and enters a new capture or locking range H', possibly after passing through a free-running range F located between the two locking ranges H and H'. Assuming that a particular frequency of a reference signal is present which holds the microwave generator 1 at the frequency $f_{sync}$, it is possible by application of the control signal 7 to cause the generator to leave this associated locking range and jump to the following capture or locking range, which is associated with another reference frequency of the corresponding modulating signal, so that the microwave generator 1 now oscillates at the frequency $f_{sync2}$, etc. In this manner, the injection-locked frequency (channel) of the microwave generator 1 can be changed by means of the control signal 7.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. A microwave generator whose microwave frequency output is optically phase-locked by means of a reference frequency of a reference signal, wherein said generator comprises an electronic circuit arrangement responsive to an optical reference carrier signal modulated with the reference frequency for providing said optically phase-locked microwave frequency output, wherein the circuit arrangement includes first and second portions, wherein the first portion, which is of a first semiconductor type, optically responds to the reference carrier signal and, thus, to the reference frequency for providing said optically phase-locked microwave frequency output, and wherein independently of the response of the first portion, the second portion, which is of a second semiconductor type, responds to an optical control carrier signal differing in frequency from the reference carrier signal for providing a control current signal, and wherein a control signal modulated onto said optical control carrier signal is used to control said control current, and wherein said first portion is responsive to said control current signal for controlling the amplitude of the optically phase-locked microwave frequency output.

2. A microwave generator as claimed in claim 1, wherein the first and second portions of both semiconductor types are arranged, preferably monolithically integrated, on a common substrate.

3. A microwave generator as claimed in claim 1, wherein the semiconductor types include silicon.

4. A microwave generator as claimed in claim 1, wherein the first portion Of the first semiconductor type comprises at least one silicon-germanium transistor, particularly a silicon-germanium heterobipolar transistor.

5. A microwave generator as claimed in claim 1, wherein the first semiconductor type photoelectrically responds to light having a wavelength of approximately 1.3 µm.

6. A microwave generator as claimed in claim 1, wherein the second portion of the second semiconductor type comprises at least one silicon bipolar transistor.

7. A microwave generator as claimed in claim 1, wherein the second semiconductor type photoelectrically responds to light having a wavelength of approximately 800 or 980 nm.

8. A microwave generator as claimed in claim 1, wherein the first portion of the first semiconductor type forms part of an oscillator circuit of the microwave generator.

9. A microwave generator as claimed in claim 1, wherein the second portion of the second semiconductor type forms part of a power supply circuit for the oscillator circuit.

10. A microwave generator as claimed in claim 1, wherein the control signal is chosen to hold the oscillator circuit of the microwave generator in a locking range.

11. A microwave generator as claimed in claim 1, wherein the reference carrier signal comprises a plurality of reference signals of unequal frequency, and that the control signal can be changed to switch the oscillator circuit from a current locking range, assigned to one of the reference signals, to another locking range, assigned to another one of the reference signals.

12. A microwave generator as claimed in claim 11, wherein the oscillator passes through a free-running range in changing from the current locking range to the other locking range.

13. An optically controlled microwave, generator, comprising an oscillator circuit and a modulator.
   wherein the oscillator circuit is excitable optically;
   Wherein a microwave carrier generated by the oscillator circuit can be modulated by an optically controllable electric switch contained in the modulator; and
   wherein the oscillator circuit is excitable with light of a first wavelength, wherein the modulator is controllable with light of a second wavelength, and wherein the oscillator circuit is insensitive to the light of the second wavelength, while the modulator is insensitive to the light of the first wavelength.

14. An optically controlled microwave generator as claimed in claim 13, wherein the light of the first wavelength and the light of the second wavelength is transmitted to the optical microwave generator together, at least over sections of a link.

15. An optical transmission system comprising an optical transmitter and an optical receiver,
   wherein the optical transmitter generates and emits light of a first wavelength and light of a second wavelength, the light of the second wavelength being modulated for transmitting a signal, and
   wherein the optical receiver includes an optically controlled microwave generator, comprising:
   an oscillator circuit and a modulator,
   wherein the oscillator circuit is excitable optically, and
   wherein a microwave carrier generated by the oscillator circuit can be modulated by an optically controllable electric switch contained in the modulator.

* * * * *

UNITED STATES PATENT AND TRADEMARK OFFICE
CERTIFICATE OF CORRECTION

PATENT NO. : 5,473,286
DATED : December 5, 1995
INVENTOR(S) : Heidemann

It is certified that error appears in the above-indentified patent and that said Letters Patent is hereby corrected as shown below: Title page:

Item [54] and col. 1, please delete "CIRCUIT" at line 1; and please insert --CIRCUITS-- prior to line 3.

At column 7, line 22 (claim 13, line 1), please delete the comma after "microwave";

at line 23 (claim 13, line 2), please change the period after "modulator" to a comma; and at line 25 (claim 13, line 4), please change "Wherein" to --wherein--.

Signed and Sealed this

Eighth Day of October, 1996

Attest:

BRUCE LEHMAN

Attesting Officer     Commissioner of Patents and Trademarks